United States Patent [19]

Stubbers et al.

[11] Patent Number: 5,012,808
[45] Date of Patent: May 7, 1991

[54] PULSE GENERATION, PARAMETER DETERMINATION, AND MODIFICATION SYSTEM

[75] Inventors: Ron Stubbers; Chen Chen; Malcolm Skolnick; Chris Hymel; Stan B. Ostrum, all of Houston, Tex.

[73] Assignee: Zion Educational Foundation, London, England

[21] Appl. No.: 258,785

[22] Filed: Oct. 17, 1988

Related U.S. Application Data

[63] Continuation-in-part of Ser. No. 95,009, Sep. 8, 1987, Pat. No. 4,779,044.

[51] Int. Cl.⁵ ............................................. A61N 1/00
[52] U.S. Cl. ............................. 128/419 R; 324/78 D; 128/423 R
[58] Field of Search ................ 324/77 R, 78 R, 78 D, 324/83 D, 79 R, 79 D; 364/413.05; 128/421, 422, 423 R, 734, 419

[56] References Cited

U.S. PATENT DOCUMENTS

| | | | |
|---|---|---|---|
| 3,971,366 | 7/1976 | Motoyama | 128/734 |
| 4,088,125 | 5/1978 | Forgione et al. | 128/734 |
| 4,093,850 | 6/1978 | Karnowski et al. | 324/78 D |
| 4,310,795 | 1/1982 | Fremery | 324/78 D |
| 4,401,121 | 8/1983 | Rodler | 128/422 |
| 4,537,203 | 8/1985 | Machida | 128/734 |
| 4,582,063 | 4/1986 | Mickiewicz et al. | 128/421 |
| 4,646,744 | 3/1987 | Capel | 128/423 R |

OTHER PUBLICATIONS

The Encyclopedia of Electronic Circuits (Rudolf Ed. 1985), ISBN 0830609385, p. 62.

Primary Examiner—Francis Jaworski
Assistant Examiner—George Manuel
Attorney, Agent, or Firm—Vaden, Eickenroht, Thompson & Boulware

[57] ABSTRACT

A pulse generation and tracking system for connection to an object or a subject under treatment therewith, the waveform being a train of repetitive complex pulses each pulse comprising a large amplitude, short duration positive polarity portion and a small amplitude, long duration negative polarity portion, and a zero value portion. The prescribed pulse train for a subject is delivered by a delivery device, which also provides monitoring of the averaged voltage amplitude of the positive portion in terms of either voltage or current value. The impedance of the subject is expected to change over time and cause the individual pulses to vary from predetermined limits. When this occurs, then a subsequent generation of pulses will be changed so that the pulses are again delivered within the predetermined value limits or boundary. Tracking and generation can be operationally crossed, if desired, so that a voltage out of boundary will cause the current of a subsequent pulse to be changed or vice versa.

36 Claims, 10 Drawing Sheets

PULSE GENERATION, PARAMETER DETERMINATION, AND MODIFICATION SYSTEM

This application is a continuation-in-part of co-pending application Ser. No. 095,009, filed Sept. 8, 1987 now U.S. Pat. No. 4,779,044.

BACKGROUND OF THE INVENTION

1. Field of the Invention

This invention pertains to the employment of a train of electrical pulses, each pulse having a positive portion of a shape different from its negative portion.

2. Description of the Prior Art

A repetitive pulse train wherein each pulse in the train is regular in shape, such as a spike, a rectangular shape, or a triangular shape, can be generated, measured and utilized in a scientific analysis or other applications using conventional procedures. The root mean square (rms) or average voltage value, similar current value or the like is measurable by conventional meters and standard generators are utilized to apply such pulse trains in scientific study or for some other useful application.

However, not all pulse trains utilize pulses of such waveshape. U.S. Pat. Application Ser. No. 095,009, Malcolm Skolnick et al, filed Sept. 8, 1987, which is incorporated herein by reference for all purposes, pertains to the measurement of pulses in a pulse train, wherein in a preferred embodiment each of the pulses have a rectangular positive polarity portion, a rectangular negative polarity portion and a portion of zero value. The amplitude of the positive polarity portion is much larger than the amplitude of the negative polarity portion and, correspondingly, the duration of the negative polarity portion is much longer than the duration of the positive polarity portion. The net charge transferred during an entire pulse delivered to a test object through which the current induced by the pulse is flowing under most conditions is zero but can be set to equal a predetermined constant. The '009 apparatus and method pertain to obtaining a meaningful value for a waveform wherein the net charge delivered by each pulse is zero. The rms or averaged meter value for this pulse is very much different from the average value of either the positive or negative pulse portions.

It is assumed in the '009 apparatus and method that the pulse train subject to measurement is independently generated from the meter used to measure the voltage, current or frequency parameters of the pulses in the train. However, there are many situations where the generation and the monitoring or tracking of the pulse train is a part of the same electronics package. That is, there are one or more predetermined characteristics of the pulses in the pulse train as such pulses are generated that make it possible to track the resulting voltage or current amplitude values, for example, by more direct means than can be accomplished when the generation means and the measuring means are completely separated and independent of one another.

Therefore, it is a feature of the present invention to provide for an improved method of generating and tracking a pulse train of repetitive pulses when the on-set time and the duration of each of said pulses is predetermined.

It is another feature of the present invention to provide an improved method of generating and tracking a pulse train of repetitive pulses by utilizing the average values of the voltage and/or the current for each pulse, which values are developed, in part, from predetermined knowledge of pulse on-set time and duration.

It is still another feature of the present invention to provide for the development of the averaged current and/or voltage value of a pulse in a repetitive pulse train by integration techniques and using one of such values for subsequent control of the same or different current and voltage values in a subsequent pulse.

It is yet another feature of the present invention to provide for the modification of a subsequent pulse from the averaged value of a preceding pulse, even when the pulse is comprised of unevenly shaped positive polarity and negative polarity portions, although the total charge delivered by the combination of the positive and negative pulses taken together as a single pulse complex is set to equal a predetermined value.

It is yet another feature of the present invention to provide for the determination and calibration of the values of operating parameters used in general operation of the system generating and tracking said pulses.

It is still another feature of the present invention to provide for the recognition of conditions when the corrections indicated necessary to modify the pulse amplitude are outside predetermined limits and to report these conditions as error messages.

SUMMARY OF THE INVENTION

The invention involves the method of generating a pulse train and subsequently tracking the pulses in the train. In an important aspect of the invention the method also involves modifying a subsequent pulse using tests of one or more of the determined parameters of an earlier pulse in the train.

Generation parameters of each pulse are defined by a predetermined amplitude value and a predetermined duration. A preferred pulse shape includes a large amplitude positive polarity portion and a negative polarity portion with a long duration, the net delivered charge for an entire pulse complex being zero or other predetermined value. The average value of a pulse is determined by integration, and a subsequent, usually not immediately subsequent pulse, is modified if the result of the averaging is not contained within predetermined limits.

The averaged pulse value for a pulse can be either its voltage value or its current value and the modification of the subsequent pulse can be either in its voltage value or in its current value.

Since a preferred pulse has a different shape for its positive polarity portion than for its negative polarity portion, when the measured "output" value is not contained within predetermined limits, the change of the size of both the positive and negative pulse values for the subsequent pulse will change in order to maintain a net charge value equal to a predetermined constant. A proportionality network assures that this uniformity is maintained. In the initial setting of waveform parameters, the amplitude of the positive polarity portion is the base. When the amplitude is incrementally changed, the amplitude of the negative portion is likewise incrementally changed. If such changes are made so that the net charge is still equal to the preestablished value, no further change of the negative polarity portion is necessary. However, the duration of the negative polarity portion is also changed when incrementally modifying the negative amplitude alone is not able to maintain the net charge value at the predetermined level and, therefore, also modifying the duration of the negative portion is also required to maintain the net charge value.

The value of the voltage or current averaged value is displayed for convenience, as selected by the operator.

One proposed application of the device is the delivery of a prescription signal transcranially to a human being under treatment. The impedance of such a load will naturally change over time and require the adjustment or modification of the pulses in the train to keep them at a mandated prescription value. If, however, a connection should become loose or disconnected, then the impedance value will vary so dramatically that the attempted "adjustment" of a subsequent pulse will go to its limit and will result in an error condition indication and/or alarm. Other circuit failures will also create an error condition indication and/or alarm.

Other refinements in the circuit include the ability to pre-program the generation and tracking apparatus for a particular subject and prescription and for stopping, starting and pausing the delivery of the pulse train to the subject as directed by the system operator. The system is self-calibrating, storage means therein containing the values of system-defining parameters for alignment, integrity of components, output scaling and integration ranges. Indications from each of the separate electronic generation and tracking devices respectively connected to several subjects under treatment can be transmitted to a central monitoring device.

BRIEF DESCRIPTION OF THE DRAWINGS

So that the manner in which the above-recited features, advantages and objects of the invention, as well as others which will become apparent, are attained and can be understood in detail, more particularly description of the invention briefly summarized above may be had by reference to the embodiments thereof that are illustrated in the drawings, which drawings form a part of the specification. It is to be noted, however, that the appended drawings illustrate only preferred embodiments of the invention and are, therefore, not to be considered limiting of its scope for the invention may admit to other equally effective embodiments.

IN THE DRAWINGS

DESCRIPTION OF THE PREFERRED EMBODIMENTS

Figure 1:
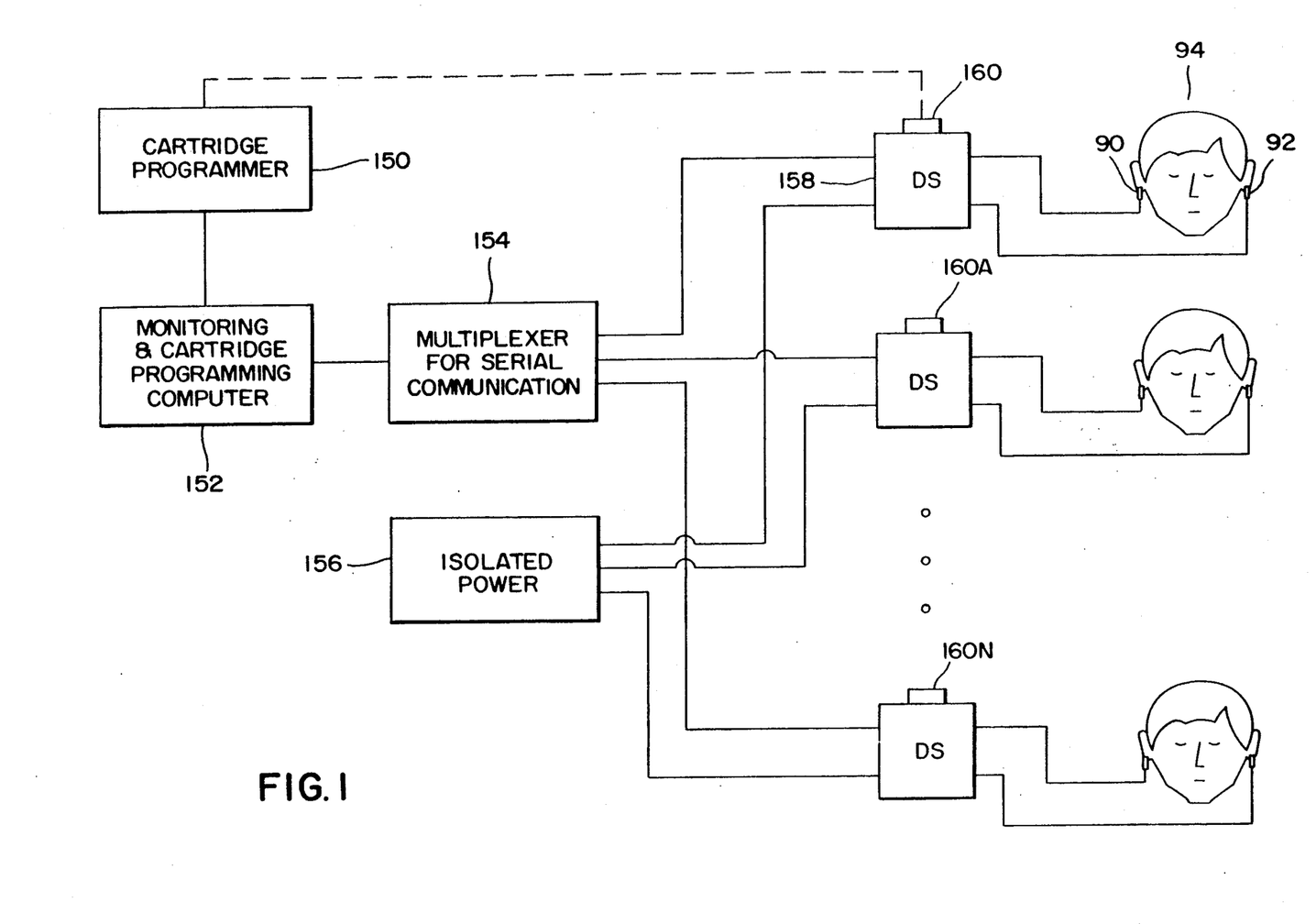
FIG. 1 is a system block diagram in accordance with a preferred embodiment of the present invention, wherein several subjects are simultaneously connected to respective pulse generation and tracking apparatus.

Now referring to the figures and first to FIG. 1, a full system configuration of a preferred embodiment of suitable generation and tracking apparatus in accordance with the present invention is shown. Such a full system embodiment utilizes some number from 1 to N of delivery system (DS) devices 158 for generation and tracking. A first subject 94, normally a human being, is connected to the system via two electrodes 90 and 92. Preferably, these electrodes are connected to the ear lobes of a subject. Selectable system and waveform parameters are programmed into a removable memory cartridge 160, such as part number DS1217A by Dallas Semiconductor, by a cartridge programmer 150 for downloading into the DS 158. Cartridge programmer 150 is connected to monitoring and cartridge programming computer 152. Communication with device 152 to a plurality of DS's 160, 160A, . . . , 160N is made possible by a serial communication multiplexer 154. Power for the DS devices is generated and isolated from the power mains for safety by an isolated power supply 156. Monitoring and cartridge programming computer 152 provides the individual prescription information to the cartridge programmer for the respective subjects and provides remote monitoring for each of the subjects connected to the respective individual delivery systems for later analysis. Each separate memory cartridge is individually programmed in accordance with a prescription determined by an operator before use by device 152 and cartridge programmer 150. The memory cartridge is then plugged into the delivery system for the respective subject, as illustrated by the dotted connection between programmer 150 and cartridge 160 shown plugged into DS 158 in the illustration.

Figure 2:
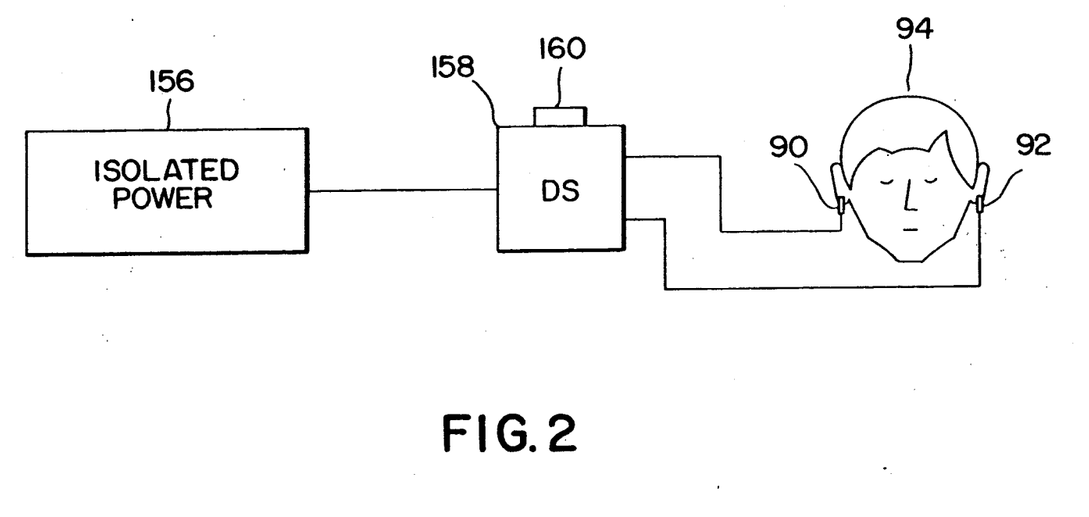
FIG. 2 is a minimal system block diagram in accordance with the present invention, wherein only one subject is connected to a pulse generation and tracking apparatus.

System configurations other than full may be realized using subsets of the above mentioned items, if desired. Monitoring device 152 is optional, and if not used removes any requirement for a serial communication multiplexer 154. FIG. 2 illustrates a minimal or single subject configuration of the preferred embodiment wherein memory cartridge 160 is assumed to have been programmed prior to system operation.

Figure 3:
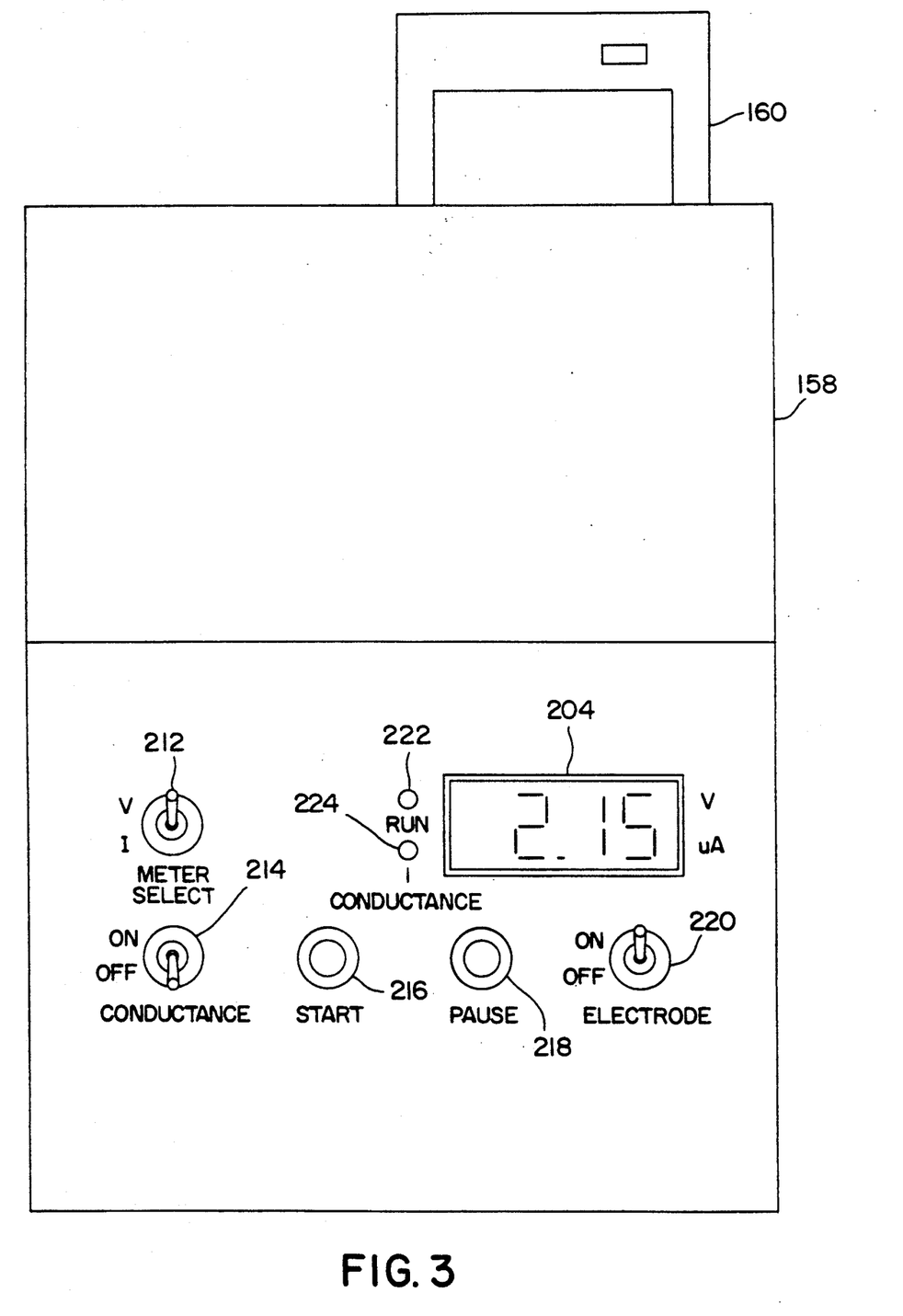
FIG. 3 is a plan view of a front panel of apparatus in accordance with a preferred embodiment, the apparatus displaying a voltage reading.
Figure 4:
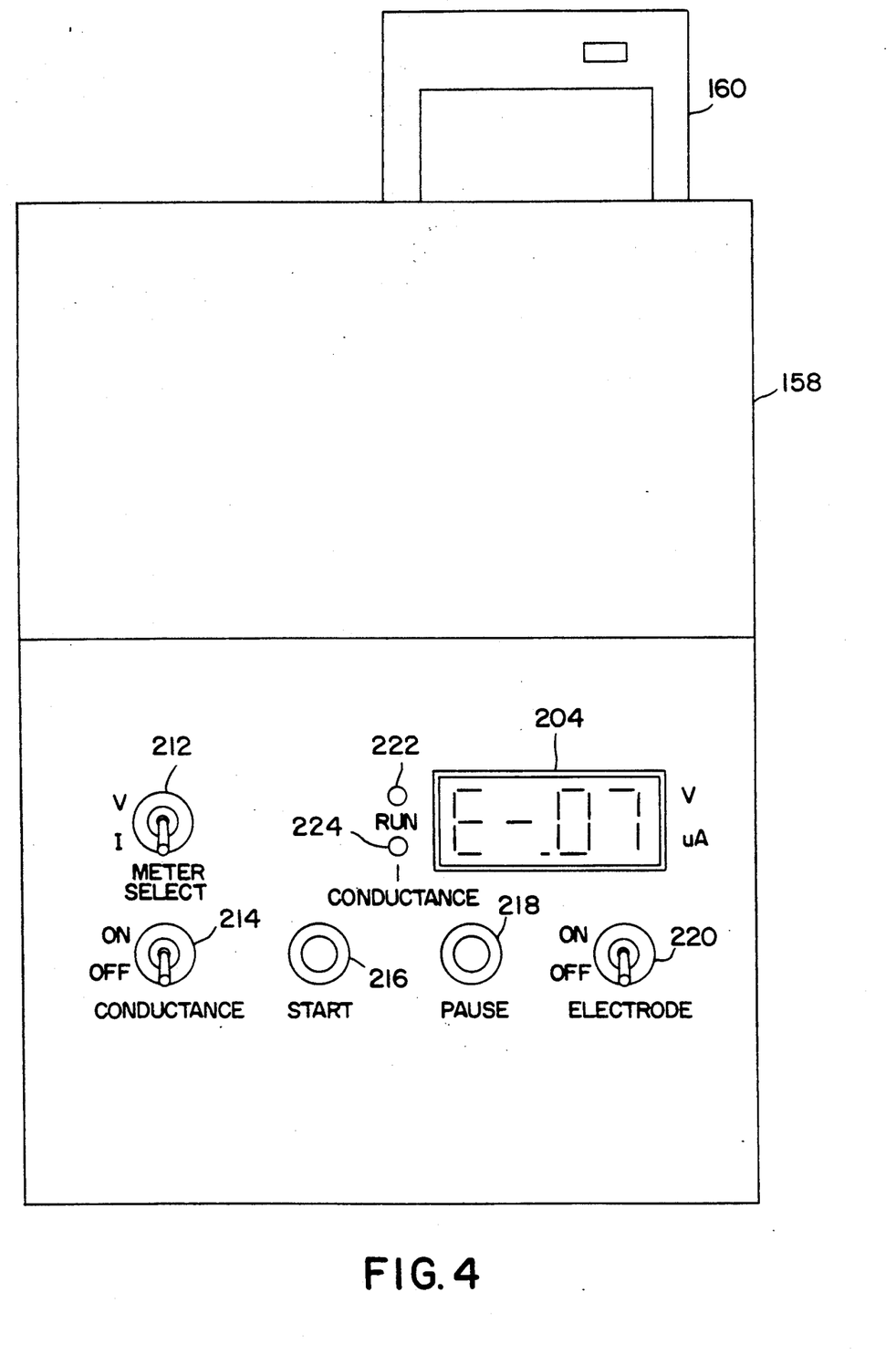
FIG. 4 is a plan view of the apparatus shown in FIG. 3, the apparatus displaying an error reading.

The front panel of delivery system 158 is illustrated in FIGS. 3 and 4. FIG. 3 shows the device measuring voltage, with a voltage reading in volts on liquid crystal display 204 on the front panel. Alternatively, a current reading in microamperes can be displayed. FIG. 4 shows the display of an error condition. Each possible error condition tested has a number that is placed in a status word when the error occurs. Some errors, such as the one illustrated in FIG. 4, are displayed on a front-panel liquid crystal display 204.

Functions that are commonly selected during the delivery of a generated waveform to a subject have switches on the delivery system front panel. These include a Pause switch 218 to allow the delivery of the generated signal to be paused without loss of position, a Start switch 216 for starting generation of the signal from a paused or stopped position, a V/I select switch 212 for determining which of the voltage or current measurements is to be displayed, a Conductance (inverse of impedance) switch 214 to allow the use of an on-system impedance measurement device for electrode placement, and an Electrode on/off switch 220 for isolating the subject from the device electrically when a signal is not being actively generated. Lights are provided to indicate normal "run" operation 222 or to indicate that a conductance measurement is being made (224). When light 222 blinks this signifies a pause condition.

Figure 5:
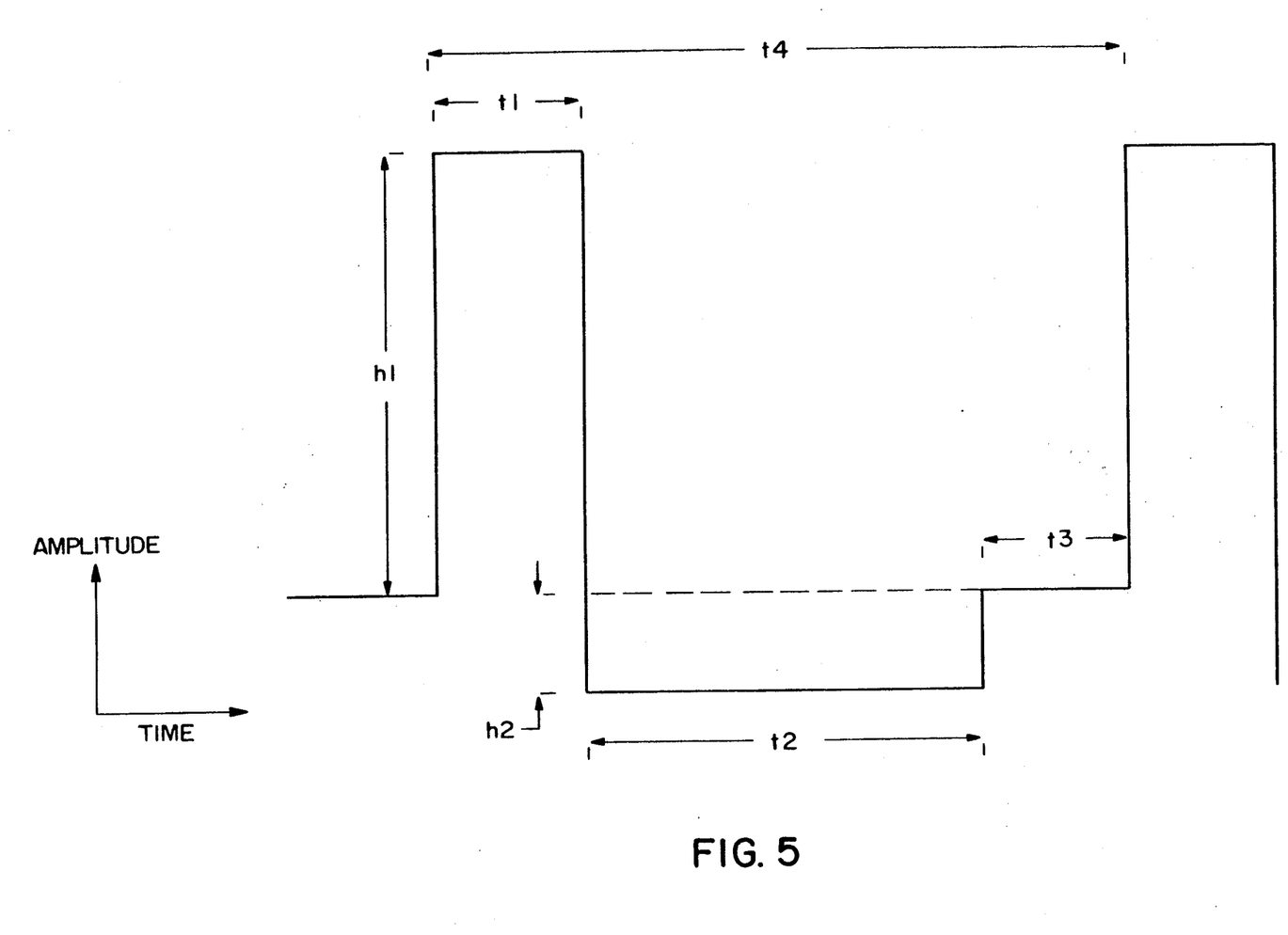
FIG. 5 is a waveform diagram of a single complex pulse in accordance with the present invention.

One pulse envelope of the waveform generated by a delivery system 158 and applied to subject 94 via electrodes 90 and 92 is illustrated in FIG. 5. In this figure, the time between successive onsets of the positive amplitude, t4, is determined by the time of the positive pulse duration t1, the time of the negative pulse duration t2 and the time the pulse is at zero volts, t3 so that t4=t1+t2+t3. The reciprocal of t4 is the selectable pulse repetition rate. As hereinafter explained the waveform is generated at its maximum amplitude and then scaled down for application to the subject. When generated, the positive pulse amplitude h1 is fixed. A selectable ratio, termed the net charge factor or NCF, is defined as (h2*t2)/(h1*t1), where h1 and t1 are fixed by the maximum pulse amplitude and, the selected positive pulse duration, respectively.

Both negative pulse amplitude h2 and negative pulse duration t2 are adjustable in finite increments, and t2 is chosen to select the minimum value of h2 required to satisfy the relation NCF=(h2*t2)/(h1*t1). If it is desirable to keep the positive area equal to the negative area for a zero net charge delivery, then the minimum negative amplitude value h2 that results in a negative pulse amplitude-pulse duration product equal to the positive amplitude-duration product is produced by selecting an appropriate value of t2 less than (t4-t1). For example, assume that there are 100 selectable incremental amplitudes for h2. If the first is selected and the duration would have to be longer than t4-t1, then a second or higher incremental amplitude number must be selected. Thus, both amplitude and duration of the negative portion are changeable, although the amplitude change alone may in some cases be satisfactory.

Once t2 has been determined, the amplitudes h1 and h2 may be changed by multiplying both by a common factor, which does not then change the ratio (h2*t2)/(h1*t1). That is, the amplitude of the waveform may be ratiometrically scaled relative to zero by the factor, but the NCF ratio remains invariant.

Figure 6:
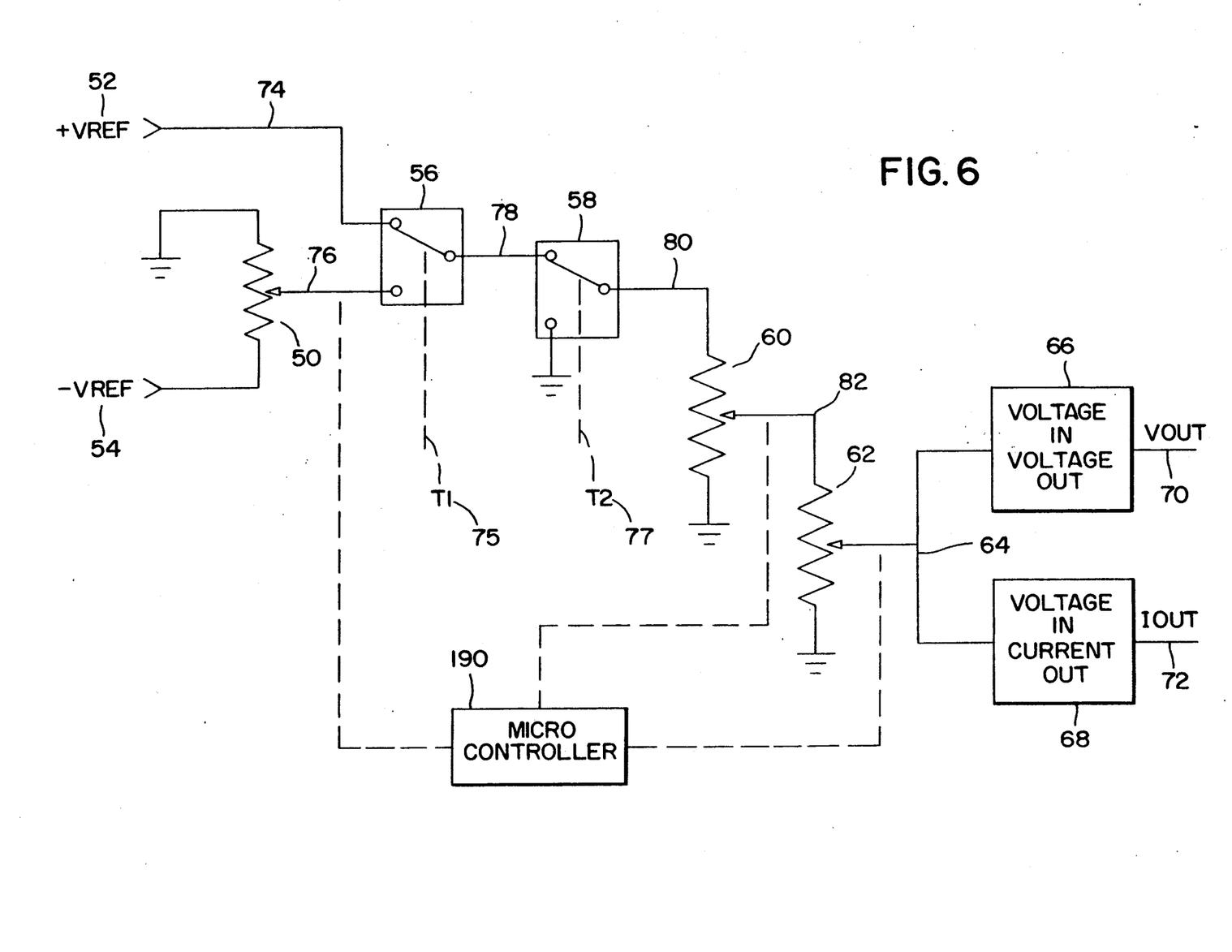
FIG. 6 is a simplified diagram of pulse train generation in accordance with a preferred embodiment of the present invention.

Repeated envelopes of the waveform in FIG. 5 to make a suitable train are generated by a preferred embodiment shown in the simplified diagram illustrated in FIG. 6. Voltage 74 is always equal to a positive maximum voltage reference level 52 and voltage 76 is determined in the range from zero volts to a maximum negative voltage reference level 54 by the position of an incrementally adjustable potentiometer 50. Switch 56, whose position is determined by timing signal 75, selects output voltage 78 therefrom to be one of input voltages 74 or 76, the voltage from the potentiometer. Switch 58 selects between input voltage 78 thereto and a zero volt level, thereby allowing its voltage 80 to be one of three possible voltage levels. Operation of switch 58 is controlled by timing signal 77. The construction of the waveform is more completely described in connection with the description of FIG. 7.

Cascaded incrementally adjustable potentiometers 60 and 62 scale voltage 80 ratiometrically relative to zero volts. The resulting scaled voltage 64 is then available to converters 66 and 68. Converter 66 receives voltage 64 and produces an output voltage 70, and converter 68 receives voltage 64 and produces a proportional output current 72. Depending upon whether the generated output of the delivery system that is then applied to subject 94 through electrodes 90 and 92 is selected to be a voltage or a current, one of signals 70 or 72 is the output of the delivery system 158 as shown in FIGS. 1 and 2.

When the generated waveform is to be scaled to compensate for changing load conditions, namely, impedance change of a subject over a period of time, the embedded microcontroller circuit 190 described hereinafter accomplishes the adjustment by incrementally changing the wiper positions of potentiometers 60 and 62.

Figure 7:
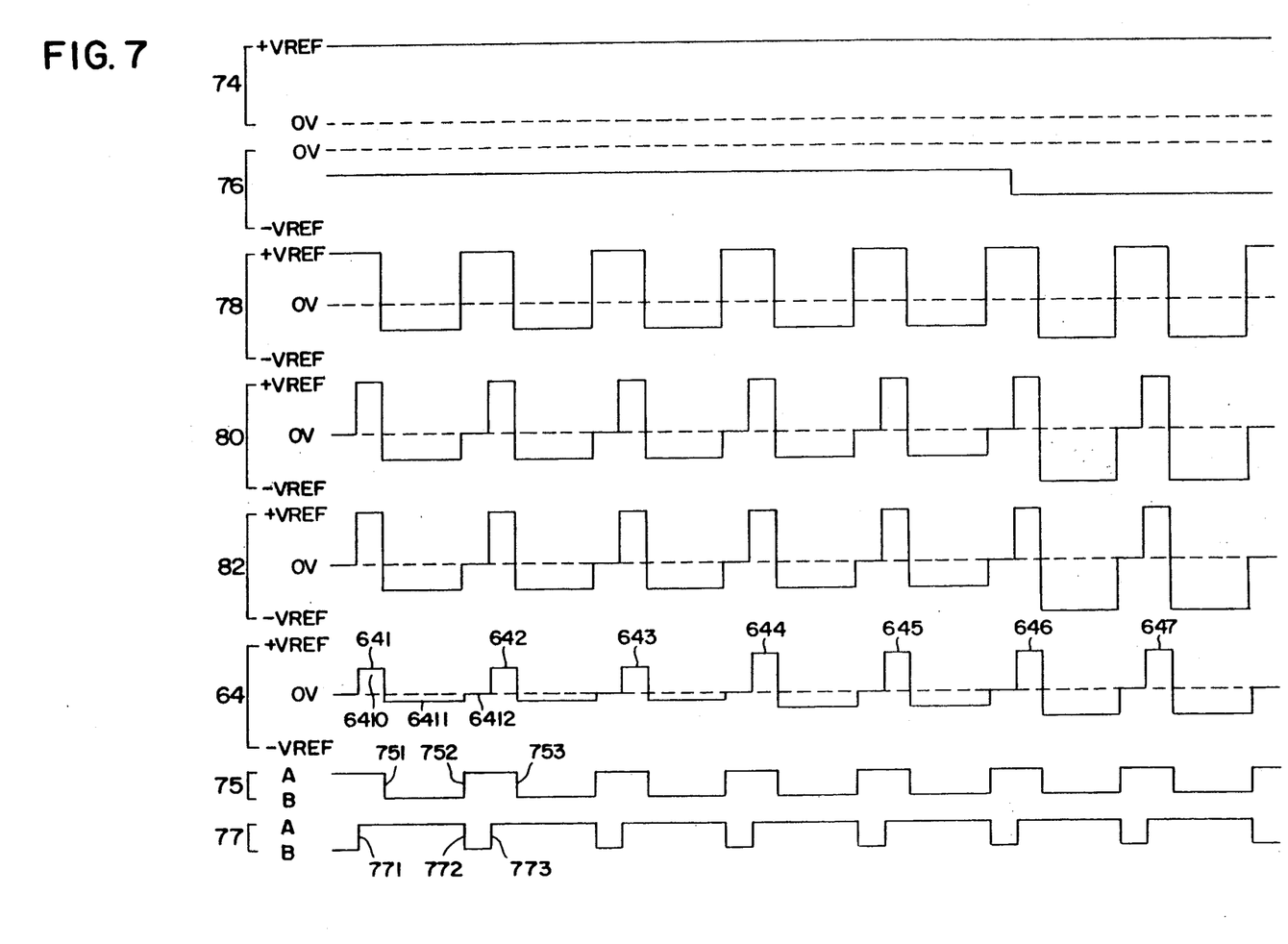
FIG. 7 is a waveform timing diagram for explaining a preferred procedure of generating a pulse train in accordance with the present invention.

The rectangular output waveform envelope as illustrated in FIG. 5 and described with respect to circuit generation devices in connection with FIG. 6 is built over several steps from two voltage sources and a number of other components. FIG. 7 shows the particular timing and nominal waveforms present in the signal generation circuitry of FIG. 6. The first three pulses in pulse train 64, namely, pulses 641, 642 and 643 illustrate the generation of a typical pulsed waveform, while next two pulses 644 and 645 show the effect of incrementally changing the position of level potentiometer item 62. Final two pulses 646 and 647 show the same scaling as the previous two pulses, but also show the effect of an increased negative voltage value. This increased negative voltage shown in pulses 646 and 647 is a result of incrementally changing potentiometer 50, shown in FIG. 6, which then changes the net charge factor, or NCF. The last two waveforms are timing waveforms t1 (75) and t2 (77), which drive the switches in the generation circuitry, and in combination also drive sample-and-hold circuit 120, and gating circuitry 100 and 134 in the measurement system shown in FIG. 8. These changes define the assembly of the pulse construction elements shown in waveforms 74, 76, 78 and 80 and to the timing waveforms shown in 75 and 77. The positive amplitude 74 is used to construct the positive polarity portion of the pulse through the action of the timing waveforms 77 and 75, wherein 771 indicates the time of onset of the positive amplitude resulting in amplitude 6410. The offset of the positive amplitude 751 serves as the onset of the negative amplitude to make the negative portion of pulse 6411, which is turned off by the timing signal 772. The cycle begins again with positive pulse on as per onset event 773.

Figure 8:
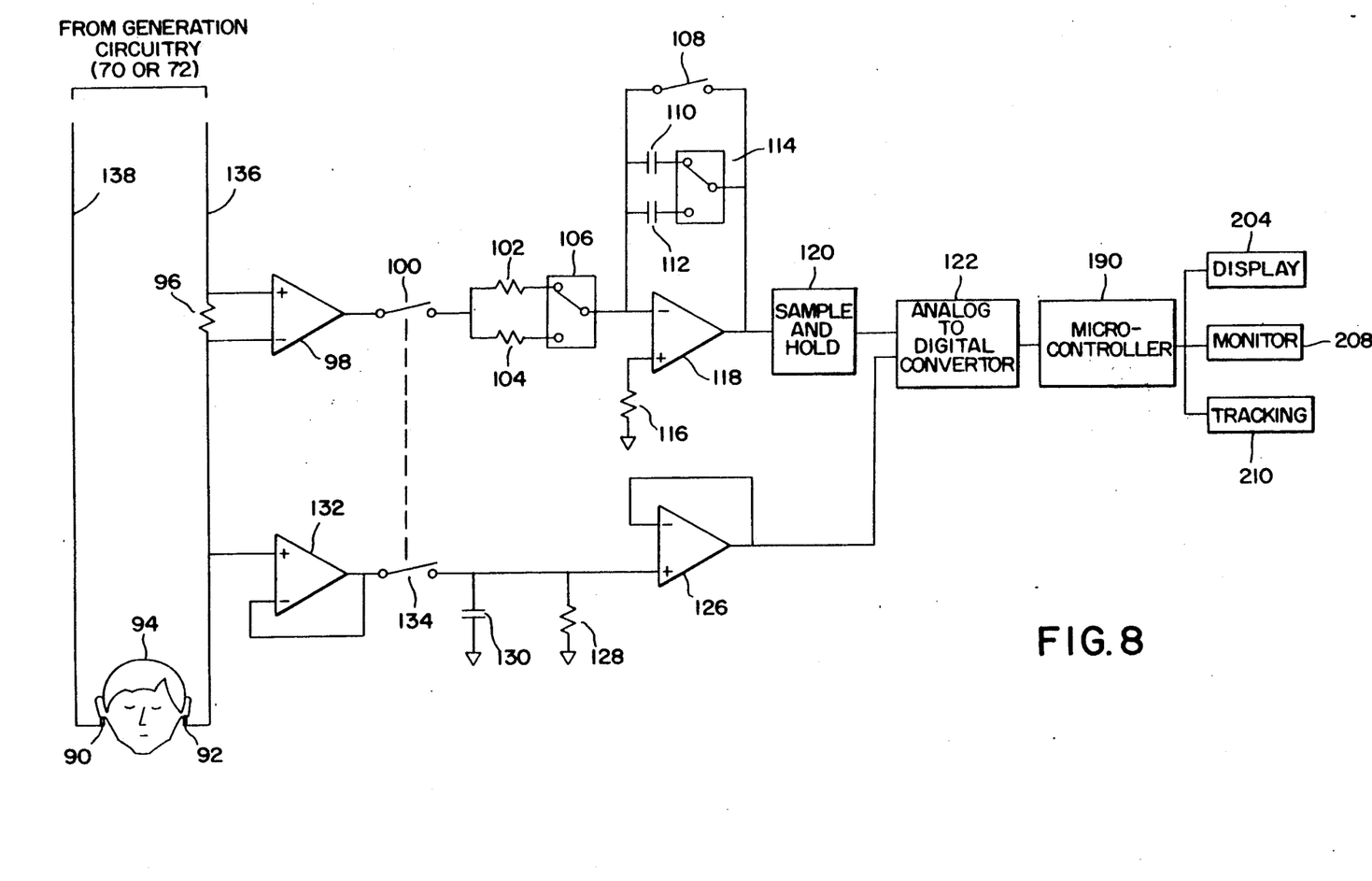
FIG. 8 is a simplified block diagram of determining averaged voltage and current readings in accordance with a preferred embodiment of the present invention.

Circuitry in the preferred embodiment for measurement of both the averaged current and averaged voltage during the positive pulse portion of the generated waveform is shown in simplified form in FIG. 8. Depending upon whether the system is programmed to generate a voltage or a current as its final output, either output voltage 70 or output current 72 is present on electrode leads 136 and 138. Current flowing to subject 94 through a small-valued sensing resistor 96 is amplified by instrument amplifier 98. Switch 100 connected to the output of amplifier 98 passes the voltage output of 98 only during the positive pulse portion of the waveform. This voltage, which is proportional to the current through resistor 96, is then integrated by amplifier 118 and a resistor selected from resistors 102 and 104 and a capacitor selected from capacitors 110 and 112. Switches 106 and 114 select the appropriate resistor and capacitor, respectively. These four components establish a four-range integrator, programmable by the two electronically settable switches.

Sample-and-hold circuit 120 holds the integrated value at the end of the positive pulse portion of the generated waveform until it can be read by analog-to-digital converter 122. When the integrated current waveform is read by the microncontroller 124, it must still be divided by the positive pulse portion duration to obtain an averaged current value. The averaged current may then be transmitted to the display and monitoring devices, as well as be used for tracking of current levels during stimulation.

An averaged voltage level is obtainable in an alternative manner. The voltage at electrode 92 is obtained by first buffering the signal with amplifier 132 and gating the signal to the measurement circuitry via switch 134 only during the positive pulse portion of the generated waveform. Capacitor 130 and resistor 128 form a long time-constant combination sample-and-hold and averager. The averaged value is then presented to one channel of analog-to-digital converter 122, which sends its product on to microcontroller 190 for display in display device 204, monitoring in monitor 208, or tracking of voltage output levels in tracking apparatus 210. In an actual circuit the operation of switches 100 and 134 are operated in time so that both current and voltage measurements are made and presented to analog-to-digital converter 122 in very close time sequence for subsequent use. Practically, these values occur substantially simultaneously. Thus, both voltage and current values are developed and usable or displayable as selected by an operator.

Figure 9:
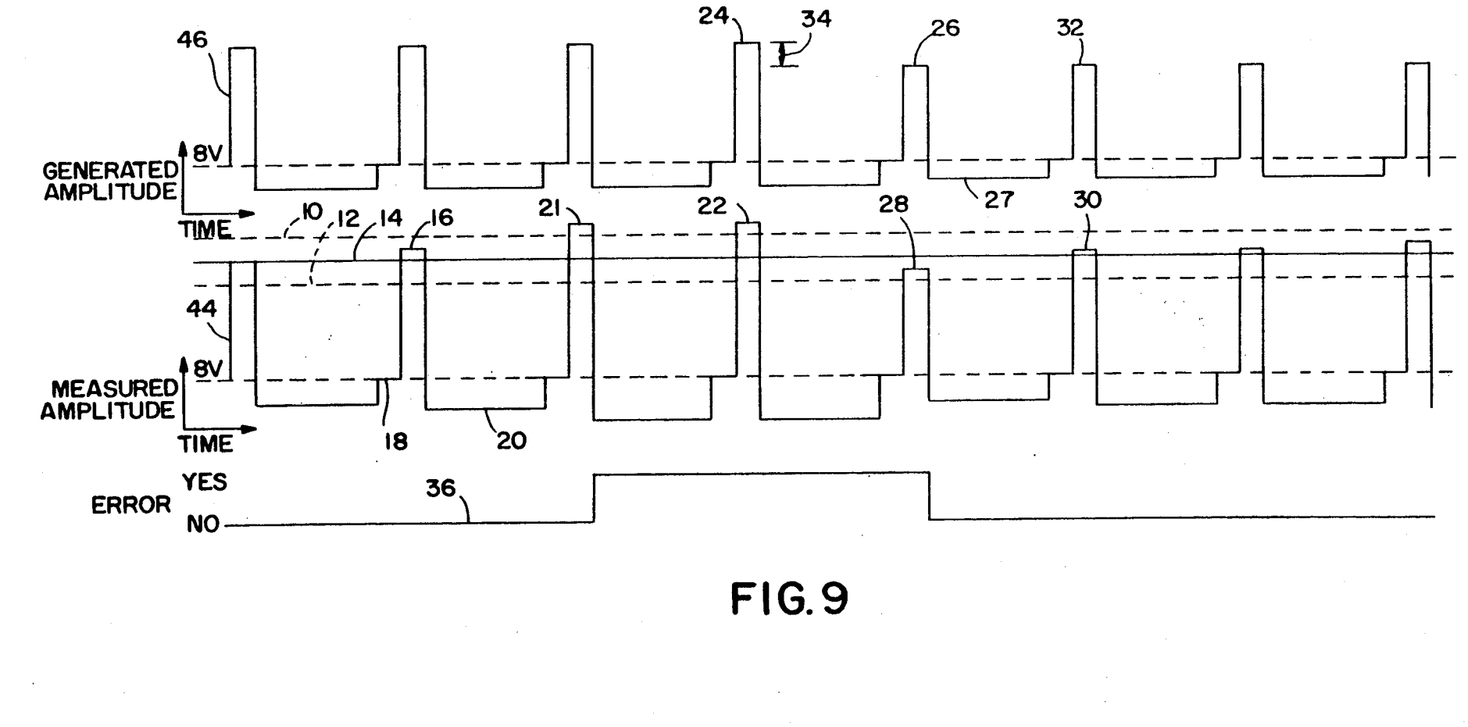
FIG. 9 is a waveform diagram of generated and tracked waveforms in accordance with the present invention.

When a generated signal is to be applied to a subject, a selectable output level and permissible deviation from that output level are chosen. The selected output level plus or minus the permissible deviation is then maintained automatically in the preferred embodiment of the delivery system by incrementally changing the scaling of the output signal relative to zero. FIG. 9 illustrates the concept of output tracking. The figure is general to the four possibilities of generated and tracked waveforms. Those four types are (1) a voltage is generated and a voltage is tracked, (2) a voltage is generated and a current is tracked, (3) a current is generated and a voltage is tracked, and (4) a current is generated and a current value is tracked. Generated signal 46 is the output 70 or 72 of the delivery system, and the tracked signal 44 is the measurement to be held constant at level 14 within selectable error bounds 10 and 12.

Starting from the left, FIG. 9 shows a constant-amplitude generated signal applied to a varying load producing a varying measured level illustrated by the difference between subsequent positive portion amplitudes 16 and 21, and the subsequent negative pulse portion amplitudes. When, as in the case of measured positive pulse amplitude 21 the value is outside the range of the error bounds 10 and 12, an error condition is generated as shown at the bottom of the figure. The system reacts to the error condition by ratiometrically changing the amplitude of the positive pulse portion 26 and negative pulse portion 27 of the generated waveform by an incremental value 34. This incremental change is accomplished by electronically adjusting the value of potentiometer 62. If, as in the case of the figure, the change in positive pulse portion amplitude of the tracked signal is enough to bring it within the error bounds 10 and 12. This is shown by pulse amplitude 28. The error condition is cleared and the new amplitude of the generated waveform is maintained as shown by pulse amplitude 32. In this way, varying load conditions during the duration of the generated signal are accommodated by adjusting the generated waveform amplitude, and keeping the tracked waveform at a selected level 14 plus or minus the selected error bounds 10 and 12.

It is possible that the adjustment to a second pulse portion amplitude may not be made to the pulse directly subsequent to the first measured pulse, as is illustrated, by measured amplitude 22 being outside the error bounds because generated pulse 24 has the same amplitude as the previous generated pulse. That is, the apparatus may well have one or more intervening pulses before the system can respond and result in a change.

Figure 10:
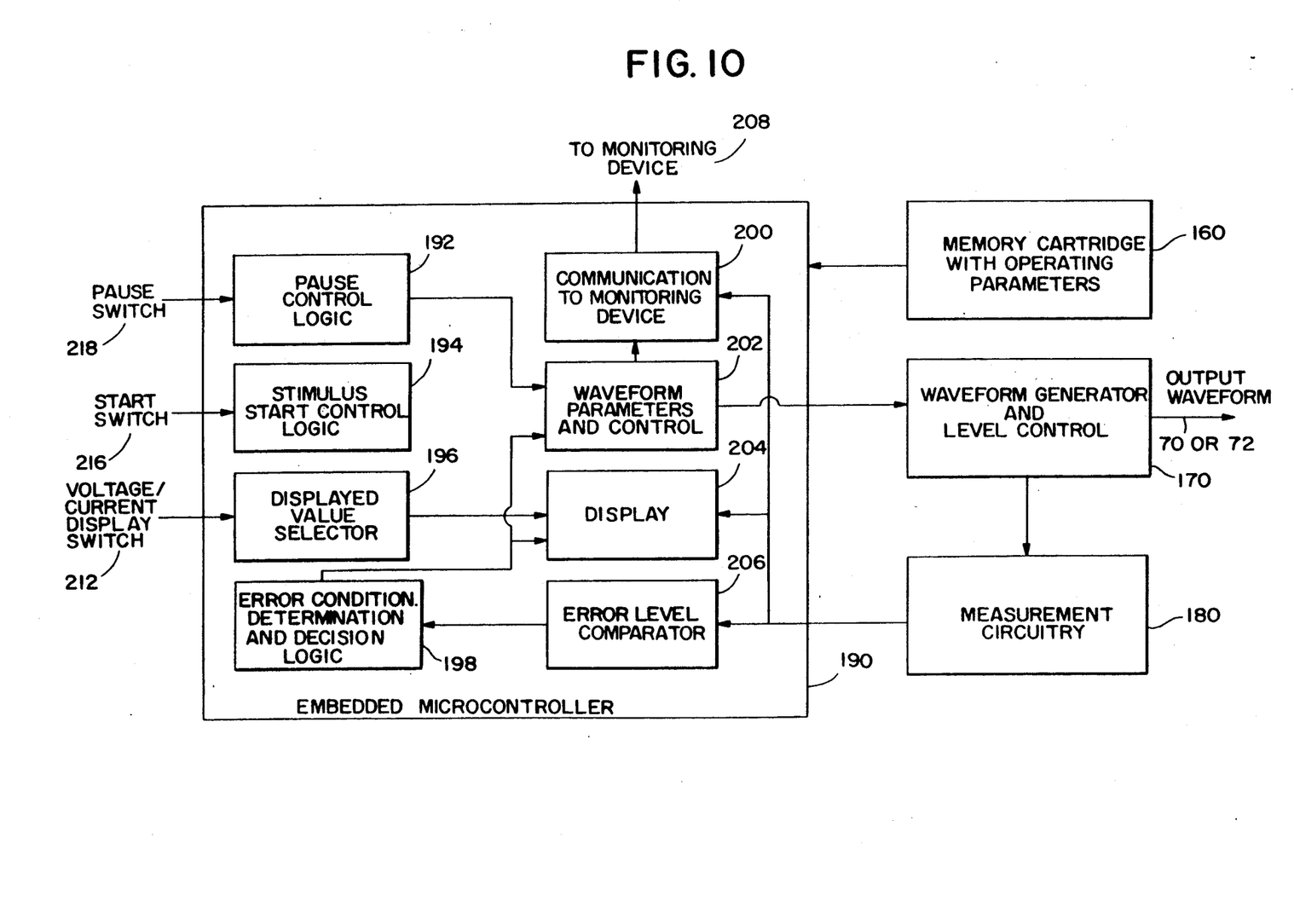
FIG. 10 is a block diagram of a preferred delivery system in accordance with the present invention.

FIG. 10 illustrates in block form the activities explained above. The embedded microcontroller 190 receives operating parameters and subject information from memory cartridge 160. These operating parameters provide initial settings for the waveform parameters and control section 202. The waveform generator and level control section generates the output waveform using parameters from item 202, and provides the actual current or voltage 72 and 70 respectively, that are applied to the subject or other load. Measurement circuitry section 180 measures the average value of the positive pulse portion of the generated and tracked waveforms and sends the results to the embedded microcontroller 190. Firmware in the embedded microcontroller compares the measured value of the tracked waveform to the tracking level 14 and the error bounds 10 and 12, and indicates to the error condition determination and decision logic 198 if a tracking error is present. If an error condition is present, section 198 causes an error status 36 to be generated. This error condition can be displayed, and is sent along with the pertinent facts surrounding the error to the waveform parameters and control block 202. This set of operations involving parameter reading and setting, pulse generation, measurement, and error condition determination, is cyclically repeated during the course of signal generation to keep the tracked waveform at the setpoint level 14 plus or minus the error levels 10 and 12.

Front panel switches 212, 216, and 218 allow the user to request activities from the embedded microcontroller via their associated logic blocks 196, 194, and 192 respectively. Activation of the pause switch 218 and pause control logic 192 causes the microcontroller to stop generation of the stimulus signal, and to hold its position in the generation of the signal so that it may be continued at a later time. The start switch 216 and stimulus start control logic 194 allow initiation of signal generation or continuation if the generation was paused. Voltage/current display switch 212 and displayed value selector 196 indicate to the microcontroller which of the current or voltage average values is to be displayed on the front-panel liquid crystal display 204.

Information can be sent to an external monitoring device 208 via the communication to monitoring device block 200. Measured values of current and voltage, and status information including error conditions can be sent to the external monitoring device.

While preferred embodiments of the invention have been shown and described, and some modifications or alternatives have been discussed, it will be understood that the invention is not limited thereto since modifications can be made and will become apparent to those skilled in the art.

What is claimed is:

1. The method of electrical pulse generation, parameter determination, and modification which comprises
   generating a train of repetitive, substantially identical electrical pulses, each pulse having a predetermined on-set time, pulse structure comprising positive and negative amplitudes, and duration, wherein the parameters determining said pulse on-set time, structure and duration can be changed to accommodate alteration of pulses for application under different conditions,
   averaging a selected one of the positive and negative amplitudes of a first pulse in said train over the predetermined duration thereof and producing a first fixed averaged pulse value,
   utilizing said first fixed averaged pulse value obtained from said averaging of said first pulse to modify a selected one of the positive and negative amplitudes of a second pulse, and
   averaging said amplitude of said second pulse in said train over the predetermined duration thereof and producing a second fixed averaged pulse value.

2. The method of electrical pulse generation, parameter determination, and modification in accordance with claim 1, wherein
   the average amplitude of said first pulse is determined by integrating the selected amplitude of said first pulse over the pulse width of said first pulse, and dividing the resulting integrated value by the pulse width of said first pulse, and
   the average amplitude of said second pulse is determined by integrating the selected amplitude of said second pulse over the pulse width of said second pulse, and dividing the resulting integrated value by the pulse width of said second pulse.

3. The method of electrical pulse generation, parameter determination, and modification in accordance with claim 1, wherein
   the average amplitude of said first pulse is determined by sampling of the selected amplitude of said first pulse at its on-set and varying therefrom with a long time constant circuit over the duration of the pulse width of said first pulse, and
   the average amplitude of said second pulse is determined by sampling of the selected amplitude of said second pulse at its on-set and varying therefrom with a long time constant circuit over the duration of the pulse width of said second pulse.

4. The method of electrical pulse generation, parameter determination, and modification in accordance with claim 1, wherein said first pulse and said second pulse are separated by at least one intervening pulse.

5. The method of electrical pulse generation, parameter determination , and modification in accordance with claim 1, wherein the shape of said substantially identically shaped pulses are each preestablished to have a rectangular positive polarity portion and a different rectangular negative polarity portion.

6. The method of electrical pulse generation, parameter determination, and modification in accordance with claim 5, wherein the amplitude of said positive polarity portion is larger than the amplitude of said negative polarity portion and including
   incrementally modifying the amplitudes of the positive polarity portions of said pulses.

7. The method of electrical pulse generation, parameter determination, and modification in accordance with claim 6, and including
   respectively modifying the amplitudes of the negative polarity portions of said pulses proportionally incrementally along with the incremental modification of the amplitudes of the positive polarity portions of said pulses.

8. The method of electrical pulse generation, parameter determination, and modification in accordance with claim 7, and including
   modifying the amplitudes and durations of the negative polarity portions of said pulses along with the modification of the amplitudes of the positive polarity portions so as to maintain energy content equality in the positive polarity portion and in the negative polarity portion of each of said pulses.

9. The method of electrical pulse generation, parameter determination, and modification in accordance with claim 1, and including
   displaying said first fixed averaged pulse value on a readout, and
   subsequently displaying said second fixed averaged pulse value on said readout.

10. The method of electrical pulse generation, parameter determination, and modification in accordance with claim 5, and including
    determining a predetermined acceptable range for the fixed averaged pulse value for each of said pulses in said train, and
    compensatingly modifying the generation of the selected pulse amplitude of said second pulse whenever said first selected averaged pulse value is outside of the predetermined acceptable range for said first pulse.

11. The method of electrical pulse generation, parameter determination, and modification in accordance with claim 10, wherein said acceptable range is selectable.

12. The method of electrical pulse generation, parameter determination, and modification in accordance with claim 10, and including
    applying said train to a load, the impedance of which is capable of varying and causing a subsequent pulse to be generated with a fixed averaged pulse value outside of said acceptable range.

13. The method of electrical pulse generation, parameter determination, and modification in accordance with claim 12, wherein said load is a transcranial connection to a human being.

14. The method of electrical pulse generation, parameter determination, and modification in accordance with claim 5, wherein
    compensatingly modifying the generation of said second pulse also includes proportionally modifying the positive polarity portion and the negative polarity portion of said second pulse in each portion whenever said first averaged pulse is outside of the predetermined acceptable range for said first pulse.

15. The method of electrical pulse generation, parameter determination, and modification in accordance with claim 14, wherein said proportional modification of the positive polarity portion and the negative polarity portion maintains the energy content of said positive polarity portion equal to a fixed ratio of the energy content of the negative polarity portion so that the net charge over each entire pulse is equal to a predetermined value.

16. The method of electrical pulse generation, parameter determination, and modification in accordance with claim 15, wherein the amplitude of said negative polarity portion is modified along with the amplitude of said positive polarity portion.

17. The method of electrical pulse generation, parameter determination, and modification in accordance with claim 1, wherein
generating each of said pulses includes generating them each to have a positive polarity portion and a negative polarity portion, said positive polarity portion having a relatively large amplitude and a relatively short duration compared with said negative polarity portion.

18. The method of electrical pulse generation, parameter determination, and modification in accordance with claim 17, wherein each said positive portion and said negative portion are each rectangularly shaped.

19. The method of electrical pulse generation, parameter determination, and modification in accordance with claim 17, wherein the ratio of the integrated value of the positive polarity portion of said pulses expressed as a function of time to the integrated value of the negative polarity portion is set to a predetermined value so that the net charge transferred during the entire pulse is equal to a predetermined value.

20. The method of electrical pulse generation, parameter determination, and modification in accordance with claim 19, wherein said predetermined ratio is one so that the net charge delivered by said entire pulse is zero.

21. The method of electrical pulse generation, parameter determination, and modification in accordance with claim 1, wherein said first and second fixed average pulse values are voltage values.

22. The method of electrical pulse generation, parameter determination, and modification in accordance with claim 21, and including
determining a predetermined acceptable range for the fixed averaged voltage value for each of said pulses in said train,
compensatingly modifying the generation of the selected pulse current amplitude of said second pulse within predetermined limits whenever said first averaged voltage value is outside of the predetermined acceptable range for said first pulse, and
indicating when said modification causes said selected pulse current amplitude of said second pulse to reach said predetermined limits.

23. The method of electrical pulse generation, parameter determination, and modification in accordance with claim 21, and including
determining a predetermined acceptable range for the fixed averaged voltage value for each of said pulses in said train,
compensatingly modifying the generation of the selected pulse voltage amplitude of said second pulse within predetermined limits whenever said selected first averaged voltage value is outside of the predetermined acceptable range for said first pulse, and
indicating when said modification causes said selected pulse voltage amplitude of said second pulse to reach said predetermined limits.

24. The method of electrical pulse generation, parameter determination, and modification in accordance with claim 25, and including
averaging the selected amplitude of the current of said first pulse in said train over the predetermined duration of said first pulse and producing a first fixed averaged current value, and
averaging the selected amplitude of the current of a second pulse in said train over the predetermined duration of said second pulse and producing a second fixed averaged current value.

25. The method of electrical pulse generation, parameter determination, and modification in accordance with claim 1, wherein said first and second fixed average pulse values are current values.

26. The method of electrical pulse generation, parameter determination, and modification in accordance with claim 25, and including
determining a predetermined acceptable range for the fixed averaged current value for each of said pulses in said train,
compensatingly modifying the generation of the selected pulse voltage amplitude of said second pulse within predetermined limits whenever said first averaged current value is outside of the predetermined acceptable range for said first pulse, and
indicating when said modification causes said selected pulse voltage amplitude of said second pulse to reach said predetermined limits.

27. The method of electrical pulse generation, parameter determination, and modification in accordance with claim 25, and including
determining a predetermined acceptable range for the fixed averaged current value for each of said pulses in said train,
compensatingly modifying the generation of the selected pulse current amplitude of said second pulse within predetermined limits whenever said first averaged current value is outside of the predetermined acceptable range for said first pulse, and
indicating when said modification causes said selected pulse current amplitude of said second pulse to reach said predetermined limits.

28. The method of electrical pulse generation, parameter determination, and modification in accordance with claim 25, wherein
the selected average amplitude of the voltage of said first pulse is determined by integrating the selected amplitude of the voltage of said first pulse over the pulse width of said first pulse, and dividing the resulting integrated value by the pulse width of said first pulse, and
the selected average amplitude of the voltage of said second pulse is determined by integrating the selected amplitude of the voltage of said second pulse over the pulse width of said second pulse, and dividing the resulting integrated value by the pulse width of said second pulse.

29. The method of electrical pulse generation, parameter determination, and modification in accordance with claim 28, including
selectively choosing for display between said first fixed averaged current value followed by said second fixed averaged current value and said first fixed averaged voltage value followed by said second fixed average voltage value.

30. The method of electrical pulse generation, parameter determination, and modification in accordance with claim 1, and including
determining a predetermined acceptable range for a selected one of the fixed averaged values of voltage and current for each of said pulses in said train, compensatingly modifying the generation of one of the pulse value amplitudes of said second pulse within predetermined limits whenever the selected one of said first pulse fixed averaged value is outside of the predetermined acceptable range, and recording the existence of an error condition caused by said modification reaching said predetermined limits, and generating an error condition signal for the existence of said error condition.

31. The method of electrical pulse generation, parameter determination, and modification in accordance with claim 30, and including transmitting the values of both said voltage fixed averaged value and said current fixed averaged value to a separate monitoring device, and transmitting said error condition to said separate monitoring device.

32. The method of electrical pulse generation, parameter determination, and modification in accordance with claim 31, and including transmitting operating status of the generation of said pulses and correctableness of said error condition.

33. The method of electrical pulse generation, parameter determination, and modification in accordance with claim 1, and including stopping said generation of said pulse train and restarting at the location in said pulse train where generation was stopped.

34. The method of electrical pulse generation, parameter determination, and modification in accordance with claim 1, and including determining if operating parameters of generation and tracking mechanisms are properly calibrated and functionally performing within acceptable, established criteria.

35. The method of electrical pulse generation, parameter determination, and modification, comprising encoding pulse parameter information in a storage means, wherein said encoded information comprises, a set of information entitled a header which contains a listing of said encoded information, said encoded information including the total length of said pulse train, the pulse duration, the inter-pulse interval, the pulse width, the acceptable range of average pulse amplitude values, and the ratio of the amplitudes of the positive and negative portions of the pulse, and transferring said encoded pulse parameter information electronically to a pulse generation, parameter generation, and modification means.

36. The method of electrical pulse generation, parameter determination, and modification in accordance with claim 35, wherein the external storage means is a programmable integrated circuit memory device, and transfer of said encoded information is accomplished by electronically reading said memory device.

* * * * *